(12) United States Patent
Fornos Martinez et al.

(10) Patent No.: US 11,733,676 B2
(45) Date of Patent: Aug. 22, 2023

(54) PATTERNS OF VARIABLE OPACITY IN ADDITIVE MANUFACTURING

(71) Applicant: HEWLETT-PACKARD DEVELOPMENT COMPANY, L.P., Spring, TX (US)

(72) Inventors: Pol Fornos Martinez, Sant Cugat del Valles (ES); Sergio Puigardeu Aramendia, Sant Cugat del Valles (ES); Ismael Fernandez Aymerich, Sant Cugat del Valles (ES)

(73) Assignee: Hewlett-Packard Development Company. L.P., Spring, TX (US)

( * ) Notice: Subject to any disclaimer, the term of this patent is extended or adjusted under 35 U.S.C. 154(b) by 0 days.

(21) Appl. No.: 16/605,227

(22) PCT Filed: Jul. 25, 2018

(86) PCT No.: PCT/US2018/043719
§ 371 (c)(1),
(2) Date: Oct. 15, 2019

(87) PCT Pub. No.: WO2020/023034
PCT Pub. Date: Jan. 30, 2020

(65) Prior Publication Data
US 2021/0405612 A1    Dec. 30, 2021

(51) Int. Cl.
*G05B 19/4099* (2006.01)
*B33Y 50/00* (2015.01)
*B29C 64/386* (2017.01)
*B33Y 80/00* (2015.01)
*B22F 10/80* (2021.01)
*G06F 30/10* (2020.01)

(52) U.S. Cl.
CPC .......... *G05B 19/4099* (2013.01); *B22F 10/80* (2021.01); *B29C 64/386* (2017.08);
(Continued)

(58) Field of Classification Search
CPC ............................ B29C 64/386; B29C 64/165
See application file for complete search history.

(56) References Cited

U.S. PATENT DOCUMENTS 9,975,323 B2 *   5/2018   Chan ........................ B32B 27/20
10,717,235 B2 *  7/2020   Brunton ................ B29C 64/393
(Continued)

FOREIGN PATENT DOCUMENTS

WO    WO2017188963 A1    11/2017
WO    WO2018046582 A1    3/2018

OTHER PUBLICATIONS

Discovery and Science Channel's How It's Made; How It's Made—Millefiori Glass Paperweights, Jan. 31, 2012, YouTube, https://www.youtube.com/watch?v=dQw_yUsTVS0 (Year: 2012).*

(Continued)

*Primary Examiner* — Leith S Shafi
*Assistant Examiner* — Nicholas J Chidiac
(74) *Attorney, Agent, or Firm* — Michael Dryja

(57) ABSTRACT

In an example, a method includes receiving, by at least one processor, object model data, the object model data describing at least part of an object to be generated in additive manufacturing. Pattern data is also received, wherein the pattern data describes a pattern of variable opacity intended to be formed internally to the object. Object generation instructions for generating an intermediate layer of the object comprising the pattern of variable opacity may be determined by at least one processor.

18 Claims, 4 Drawing Sheets

(52) U.S. Cl.
    CPC .............. *B33Y 50/00* (2014.12); *B33Y 80/00* (2014.12); *G05B 2219/35134* (2013.01); *G05B 2219/45028* (2013.01); *G06F 30/10* (2020.01)

(56) References Cited

U.S. PATENT DOCUMENTS

| | | |
|---|---|---|
| 11,613,646 B2* | 3/2023 | Querol Esparch ..... B33Y 70/00 428/402 |
| 2005/0072113 A1 | 4/2005 | Collins et al. |
| 2008/0122141 A1 | 5/2008 | Bedal et al. |
| 2015/0258770 A1* | 9/2015 | Chan .................... C09D 11/322 700/98 |
| 2017/0120338 A1 | 5/2017 | Goeing et al. |
| 2017/0297106 A1 | 10/2017 | Myerberg et al. |
| 2018/0015663 A1 | 1/2018 | Zhao et al. |
| 2018/0117849 A1* | 5/2018 | Brunton ................ B29C 64/393 |
| 2020/0316849 A1* | 10/2020 | Ohi ........................ B33Y 80/00 |
| 2021/0277222 A1* | 9/2021 | Querol Esparch ..... C08K 3/346 |
| 2021/0331404 A1* | 10/2021 | Jowkar ................. B29C 64/232 |

OTHER PUBLICATIONS

Li et al., AirCode: Unobtrusive Physical Tags for Digital Fabrication, Columbia University, New York, NY, 2017 14 pages.
Suzuki et al., Embedding Information into Objects Fabricated With 3-D Printers by Forming Fine Cavities inside Them, IS&T International Symposium on Electronic Imaging 2017.

* cited by examiner

PATTERNS OF VARIABLE OPACITY IN ADDITIVE MANUFACTURING

BACKGROUND

Additive manufacturing techniques may generate a three-dimensional object through the solidification of a build material, for example on a layer-by-layer basis. In examples of such techniques, build material may be supplied in a layer-wise manner and the solidification method may include heating the layers of build material to cause melting in selected sub-regions. In other techniques, chemical solidification methods may be used.

BRIEF DESCRIPTION OF DRAWINGS

Non-limiting examples will now be described with reference to the accompanying drawings, in which.

DETAILED DESCRIPTION

Figure 1:
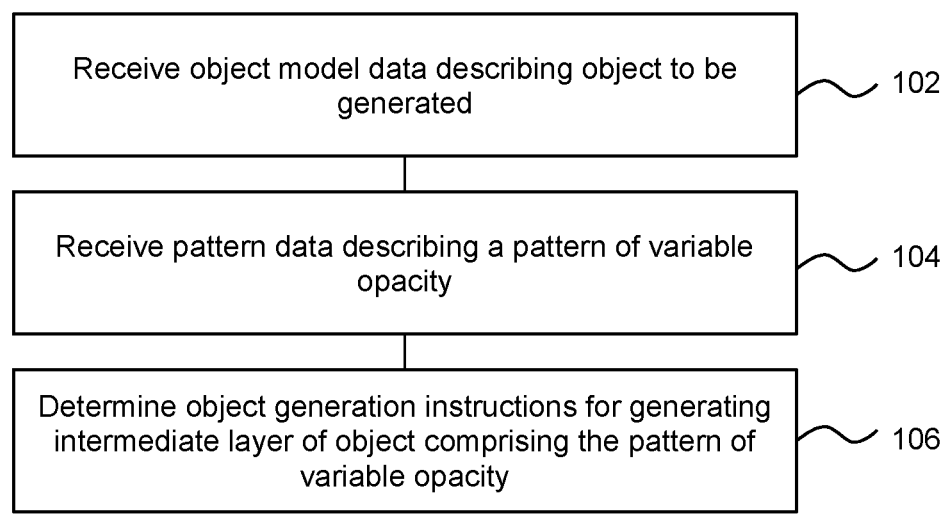
FIG. 1 is a flowchart of an example method of processing data for use in additive manufacturing.

Additive manufacturing techniques may generate a three-dimensional object through the solidification of a build material. In some examples, the build material is a powder-like granular material, which may for example be a plastic, ceramic or metal powder and the properties of generated objects may depend on the type of build material and the type of solidification mechanism used. Build material may be deposited, for example on a print bed and processed layer by layer, for example within a fabrication chamber. According to one example, a suitable build material may be PA12 build material commercially known as V1R10A "HP PA12" available from HP Inc.

In some examples, selective solidification is achieved through directional application of energy, for example using a laser or electron beam which results in solidification of build material where the directional energy is applied. In other examples, at least one print agent may be selectively applied to the build material, and may be liquid when applied. For example, a fusing agent (also termed a 'coalescence agent' or 'coalescing agent') may be selectively distributed onto portions of a layer of build material in a pattern derived from data representing a slice of a three-dimensional object to be generated (which may for example be generated from structural design data). The fusing agent may have a composition which absorbs energy such that, when energy (for example, heat) is applied to the layer, the build material coalesces and solidifies to form a slice of the three-dimensional object in accordance with the pattern. In other examples, coalescence may be achieved in some other manner.

In an example, a suitable fusing agent may be an ink-type formulation comprising carbon black, such as, for example, the fusing agent formulation commercially known as V1Q60Q "HP fusing agent" available from HP Inc. In some examples, a fusing agent may comprise at least one of an infra-red light absorber, a near infra-red light absorber, a visible light absorber and a UV light absorber. Examples of print agents comprising visible light enhancers are dye based colored ink and pigment based colored ink, such as inks commercially known as CE039A and CE042A available from HP Inc.

In addition to a fusing agent, in some examples, a print agent may comprise a coalescence modifier agent, which acts to modify the effects of a fusing agent for example by reducing or increasing coalescence or to assist in producing a particular finish or appearance to an object, and such agents may therefore be termed detailing agents. In some examples, detailing agent may be used near edge surfaces of an object being printed. According to one example, a suitable detailing agent may be a formulation commercially known as V1Q61A "HP detailing agent" available from HP Inc. A coloring agent, for example comprising a dye or colorant, may in some examples be used as a fusing agent or a coalescence modifier agent, and/or as a print agent to provide a particular color for the object.

As noted above, additive manufacturing systems may generate objects based on structural design data. This may involve a designer generating a three-dimensional model of an object to be generated, for example using a computer aided design (CAD) application. The model may define the solid portions of the object, and in some examples properties such as color, strength, density and the like. To generate a three-dimensional object from the model using an additive manufacturing system, the model data may in some examples be processed to generate slices of parallel planes of the model. Each slice may define a portion of a respective layer of build material that is to be solidified or caused to coalesce by the additive manufacturing system.

FIG. 1 is an example of a method, which may comprise a computer implemented method, and/or which may comprise a method of determining object generation instructions for generating at least one object layer by additive manufacturing. The method comprises, in block 102, receiving, by at least one processor, object model data, the object model data describing at least part of an object to be generated in additive manufacturing.

The object model data may comprise data representing at least a portion of an object to be generated by an additive manufacturing apparatus by fusing a build material. The object model data may for example comprise a Computer Aided Design (CAD) model, and/or may for example comprise a STereoLithographic (STL) data file, and/or may be derived therefrom. In some examples, the data may be received over a network, or received from a local memory or the like. In some examples, the data may define the shape of the part of an object, i.e. its geometry. In some examples, the data may define an appearance property, for example at least one intended colour, pattern, translucency, gloss or the like. In some examples the data may define at least one mechanical property, for example strength, density, resilience or the like. In some examples, the data may define at least one functional property, for example, conductivity in at least one object portion. Such properties may be associated with regions of the object, for example a color may be defined at an object surface.

In some examples, the object may be defined in terms of sub-volumes, each of which represents a region of the object which is individually addressable in object generation. In some examples herein, the sub-volumes may be referred to as voxels, i.e. three-dimensional pixels, wherein each voxel occupies or represents a discrete volume. In some examples of additive manufacturing, three-dimensional space may be characterised in terms of such voxels. In some examples, the voxels are determined bearing in mind the print resolution of an object generation apparatus, such that each voxel represents a region which may be uniquely addressed when applying print agents, and therefore the properties of one voxel may vary from those of neighbouring voxel(s). In other words, a voxel may correspond to a volume which can be individually addressed by an object generation apparatus (which may be a particular object generation apparatus, or a class of object generation apparatus, or the like) such that the properties thereof can be determined at least substantially independently of the properties of other voxels. For example, the 'height' of a voxel may correspond to the height of a layer of build material. In some examples, the resolution of an object generation apparatus may exceed the resolution of a voxel. In general, the voxels of an object model may each have the same shape (for example, cuboid or tetrahedral), but they may in principle differ in shape. In some examples, voxels are cuboids having the height of a layer of build material. In some examples, in processing object model data representing an object, each voxel may be associated with properties, and/or object generation instructions, which apply to the voxel as a whole.

In other examples, the object may be described in some other way, for example using a vector or polygon mesh based model. In some such examples, a voxel model may be derived from another model type.

In some examples, the method of FIG. 1 may be carried out on a slice by slice basis. In some examples, each slice may correspond to a layer to be generated in a layer-by-layer additive manufacturing process. In some examples, such slices may be slices of a virtual build volume modelling an intended 'real' build volume, and may comprise slices taken from more than one object model. In some examples, the slices may be one voxel thick.

The method then proceeds to block 104, which comprises receiving, by at least one processor, pattern data, wherein the pattern data describes a pattern of variable opacity intended to be formed internally to the object.

In some examples, the pattern may comprise at least one of text, an image, a number, an identifier (which may be intended to be a unique identifier identifying an individual instance of a printed object), a machine readable code such as a bar code or Quick Response (QR) code, a shape, a repeating pattern or the like. In some examples, the pattern data may define the pattern in terms of voxel or pixels. In some examples, the pattern may be a two-dimensional pattern. As will be further set out hereinafter, in some examples, the pattern may be produced in at least one layer of the object when it is generated. In some examples, the pattern data may define lower opacity portions of the pattern, and not higher opacity portions (or vice versa). For example, higher opacity portions may, in some such examples, be provided by object portions/regions surrounding the defined lower opacity portions/regions.

In some examples herein, the pattern may be intended to be visible when light is viewed through the object, for example when the object is backlit.

In some examples, opacity may be measured in terms of a ratio between the intensity of light which enters an object (or medium) and the intensity of light which travels through the medium to be emitted. For example, according to some definitions:

Opacity=$100\%(1-I(x)/I_o)$, where $I(x)$ is the intensity of light having travelled a distance x through the medium and $I_o$ is the initial intensity of the light (i.e. when x=0).

Thus, the variation in opacity in the pattern to be formed in internally to the object may depend on various factors, such as the transparency of the build material, the thickness of the object, the number of patterned layers and the like. However, in some examples, it may be that an object generated using the method is intended to have a pattern with a variation in opacity between the lower and higher opacity portions which is perceptible by the human eye. In one example, this may be a difference in opacity of around at least 5%, or around at least 10%, or a greater difference.

Patterns of variable opacity may be generated in additive manufacturing in a number of ways. For example, different colours may be used. In one example, a dark or black fusing agent (e.g. fusing agent comprising carbon black) may be used in some portions of the pattern and a light or low-tint fusing agent may be used in other portions. Low-tint fusing agents which have a relatively high absorptance (for example comprising a Caesium Tungsten Bronze, or a Caesium Tungsten Oxide composition) and which are lighter in color than a carbon black based print agent may be used in some examples. Combinations of such methods may also be used to generate a pattern of variable opacity and/or the pattern of variable opacity may be a pattern with two or more levels of opacity.

In some examples, a dark fusing agent may be applied to form a pattern and other portions of the pattern may be left untreated with a fusing agent. Portions of those sections which are not treated may, in some examples, fuse in any event due to transfer of heat from the portions of build material to which fusing agent is applied. However, in other examples, untreated portions may remain unfused. Where the fusing agent is dark in colour, the untreated portions (whether fused or unfused) may be lighter and more transmissive to light than the portions treated with fusing agent and therefore a pattern of variable opacity may be formed within an object.

Block 106 comprises determining, by at least one processor, object generation instructions for generating an intermediate layer of the object comprising the pattern of variable opacity. In some examples, this may comprise determining a placement of the pattern within the object. This may mean selecting at least one layer in which the pattern is to appear, and/or placing the pattern within an xy plane of the layer.

In some examples, the pattern may be used to overwrite existing model data. For example, where an object is defined in a voxel-wise manner, interior voxels of the object may be replaced with voxels representing at least part of the pattern (for examples voxels supplied as or derived from the pattern data). Adding or replacing voxels (whether the voxels are defined in object properties such as translucent/opaque, or in terms of print agents such as fusing agent/untreated or carbon black fusing agent/low-tint fusing agent, or some other print agent choice) is relatively simple to achieve in processing terms and relatively economical in terms of the processing resources consumed.

In other examples, an AND operation may be carried out to add the pattern data into a model. For example, where the object model data is a mesh model, the pattern may be placed within the mesh and, in some examples, the mesh including the pattern may be 'voxelised' to generate voxels therefrom.

The object generation instructions may specify the placement of print agents, such as fusing agents and any other agents, in order to generate the object. The object generation instructions may for example associate a choice and/or an amount of print agent with a voxel, such that the associated print agent will be applied to a physical location corresponding to that voxel. Such instructions may be derived or determined bearing in mind thermal considerations. For example, a voxel representing a location in the middle of the object will be surrounded by other voxels representing locations on to which fusing agent may be applied, and which therefore efficiently absorb energy. During object generation, such a location will therefore tend to be hotter than a location at the edge of an object assuming the same amount of fusing agent is applied. Therefore, the object generation instructions may be derived so as to vary the amount of fusing agent associated with a voxel (or a location within the object as defined in some other way) so as to compensate for such thermal effects such that regions of build material corresponding to voxels reach a fusing temperature without excessive overheating. The object generation instructions may also be configured to generate an object having intended object appearance, for example a colour or the like, and/or may vary with specified object properties. In some examples, at least one of these object properties may be specified in the object model data.

In some examples, determining object generation instructions may comprise applying halftoning to voxels associated with object generation parameters to determine object generation or print instructions for the layer. As will be familiar to the skilled person, halftoning can result in the selection of a particular print agent in a particular location. For example, an object generation parameter may specify an area coverage or contone level for a print agent. A halftoning screen or algorithm may be used to make selections of locations and amounts of print agents to be placed to produce an intended result (which may be fusion of build material in a simple example, but which may comprise color, transparency, conductivity, density and the like in other examples), for example based on the area coverage. While halftoning is used in this example, in other examples, other techniques may be used. For example, if using piezo printheads, a drop volume could be directly specified. If the additive manufacturing technique is or includes a selective laser sintering technique, the method may comprise specifying a power level of a laser.

The method of FIG. 1 therefore allows information to be added to a generated object in an intermediate layer, and therefore may avoid changes to the surface shape and/or appearance except in certain conditions (such as when backlit), without the separate manufacture and assembly of multiple object portions. In some examples, as further detailed below, unfused build material within an object to be generated based on the instructions may be minimised and/or avoided to avoid changes to mechanical properties (such as object strength).

Figure 2:
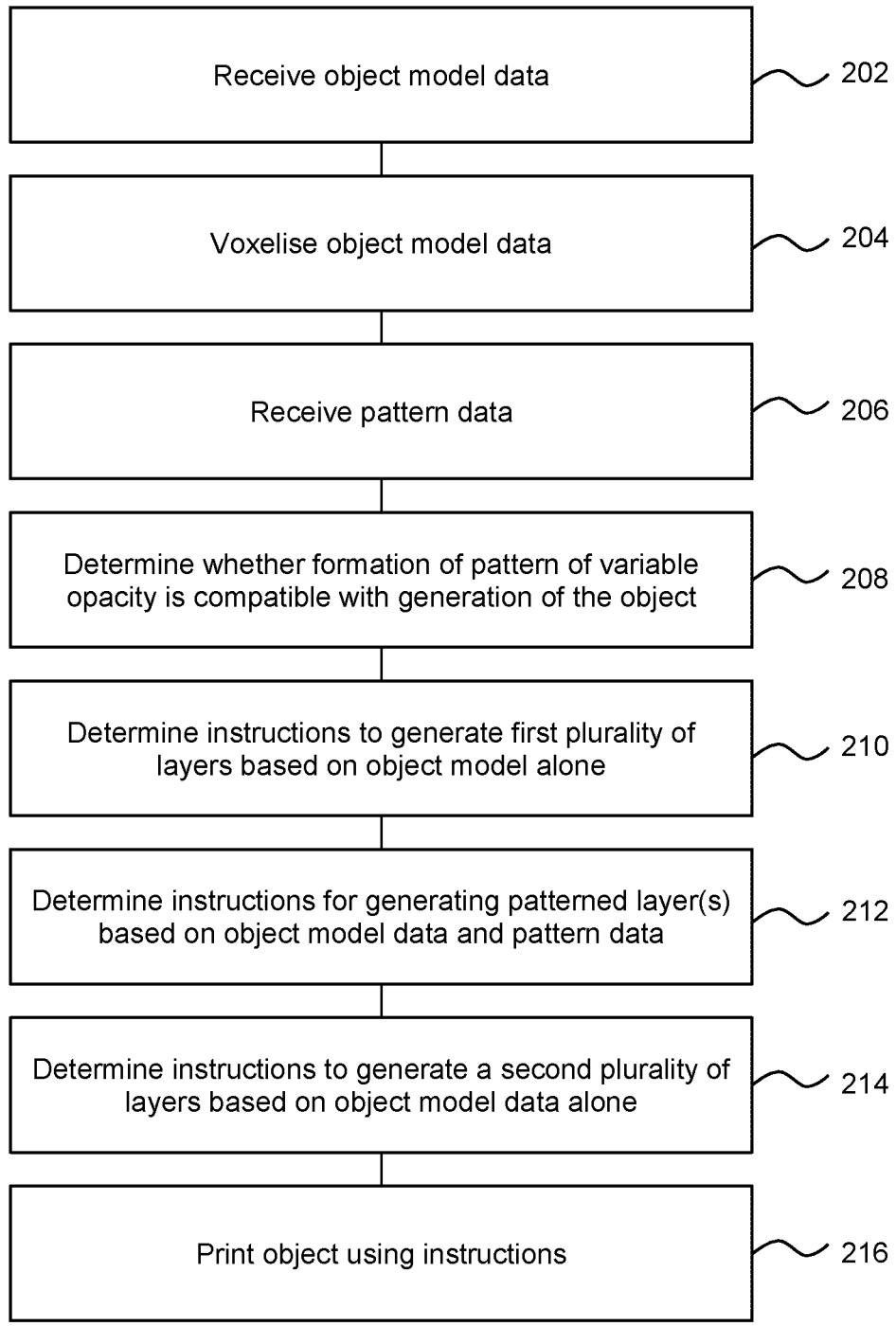
FIG. 2 is a flowchart of an example method of generating an object.

FIG. 2 is an example of a method of generating a three-dimensional object. The method comprises, in block 202, receiving object model data for example as described in relation to block 102 above. In block 204, the object model data is 'voxelised', i.e. the object model is converted into a set of voxels. A voxel may indicate the presence of an object portion (and in some examples its absence) in a location in space. In some examples, object model data may be voxelised in slices, to provide a set of voxelised slice models.

Block 206 comprises receiving pattern data, for example as described above in relation to block 104. In this example, the pattern data is voxelised data. In particular, in this example, the data specifies, for each voxel, whether that voxel is intended to be relatively translucent or relatively opaque. However, in other examples pattern data may specify whether or not each of a plurality of voxels is to receive a fusing agent, or a choice of fusing agent, or just the lower opacity voxels the like.

Block 208 comprises determining whether formation of the pattern of variable opacity is compatible with object generation. In one example, this may comprise determining the number of layers with which the object is to be formed. As the pattern is to be formed in the interior of the object, at least some layers may be dedicated to being top portions and bottom portions, in which the pattern is not to be formed, and which serve to 'mask' the pattern in some viewing states. For example, there may be at least 6 layers defined before the pattern is incorporated into the object and at least 10 layers defined after the pattern is incorporated into the object. In such examples, it would not be possible to include a pattern when an object was to be formed in less than 16 layers (which might, in some examples, equate to around 2 mm thick, using 0.12 mm height layers). These numbers are given by way of example and the number of layers reserved as top and bottom layers may be different in other examples.

In some examples, it may be determined whether the pattern size is below a threshold based on an object layer size. For example, it may be determined whether the pattern is too big to fit within an object or a particular object portion (for example, it extends beyond the footprint of the object/object portion, and/or in some examples would be so close to an edge of an object as to interfere with, and/or be visible through, the sides thereof).

In another example, determining whether formation of the pattern of variable opacity is compatible with generation of the object may comprise determining if the object will be too thick to allow the internal pattern to be discerned, even if the object is backlit, due to light absorption even by the relatively transparent portions of the pattern. For example, a maximum thickness of an object may be around 4 cm-10 cm, although this may vary considerably with material choices.

Object thickness and/or portion size may in addition impact the choice of the position of the pattern within the object. For example, a pattern may be placed in an object portion which has a thickness and/or a footprint suitable to receive the pattern.

In addition, as noted above, in an example where a single fusing agent is to be used, such as a carbon black based fusing agent, it may be intended that all of the build material over at least a portion of a layer of build material is caused to fuse. This in turn means that all of the build material within that portion should reach its melting point. To ensure that this is possible, the internal object portions may be defined to be within a treated/non-treated ratio. For example, it may be specified that each portion associated with a voxel which is to remain untreated by fusing agent is to have at least a portion of its nearest neighbours which are treated with fusing agent.

To consider a particular example, if a set of nearest neighbours is defined as being, say 25 (i.e. each voxel is treated as the centre of a 5 by 5 square), it may be determined that at least 5 of the voxel locations are to receive fusing agent, otherwise fusion of the entire set of neighbours is unlikely to be achieved. However, these numbers are simply examples, and the choice of print materials is highly relevant to the parameters adopted in practice. For example, in a given additive manufacturing apparatus it has been demonstrated that if the build material is a polypropylene powder, stripes of 10 voxels wide printed with carbon black can be separated by stripes of untreated build material which are 5 voxels wide, and the untreated voxels may be caused to fuse (in this example, the voxels may be defined at 600 dpi, having measuring 42 microns$^2$ in an xy plane). However, using a different material such as PA12 as mentioned above, the untreated stripes may be not more than 3 voxels wide if they are intended to fully fuse.

By ensuring that all the build material fuses, any changes to the mechanical properties of a generated object may be minimal. In other words, if all the material is caused to fuse by ensuring that the treated/non-treated ratio is sufficiently high and/or the print agent placement pattern is sufficiently dense (or through use of a low-tint fusing agent), an object generated with or without the pattern may have substantially the same mechanical properties such as strength and the like.

If the determination in block 208 is that the pattern may not be incorporated into an object, the method may terminate. In other examples, following a negative determination in block 208, object generation instructions may be determined which do not include the pattern. In other examples, the pattern may be modified such that it is suitable for incorporation in the object. In still other examples, a warning may be generated and a user may choose to continue with the modification of the object design to include the pattern or not. For example, a warning may be generated to indicate that not all the build material will be caused to fuse (which may in turn impact the mechanical properties such as strength and interlayer bonding), and a user may decide whether this is acceptable under the circumstances. In other examples, the decision may be made automatically, for example based on comparing a predicted change in parameters to a threshold of an acceptable change in parameters.

If however the determination in block 208 is that the pattern may be incorporated into an object, and that an object may be successfully generated, the method proceeds to block 210.

In block 210 the method comprises determining object generation instructions to generate a first plurality of layers based on the object model alone. For example, these may comprise a predetermined number of bottom layers, which may serve as masking layers to 'hide' the pattern of variable opacity from view except when backlit. The number of layers in the first plurality of layers may be predetermined. In this example, the first plurality of layers is generated so as to have a relatively high opacity. For example, the opacity of each layer of the first plurality of layers may match the relatively high opacity portions of the pattern.

In block 212, object generation instructions for generating at least one patterned layer are determined based on the object model data and the pattern data. In this example, the voxels of the voxelised object model data of a slice are overwritten with the voxels of the pattern data where the two coincide. In this example, determining the object generation instructions to generate the intermediate layers comprises determining object generation instructions to apply a fusing agent—in this example carbon black based fusing agent—to generate a region of higher opacity and instructions not to apply any fusing agent to generate a region of lower opacity.

In block 214, the method comprises determining object generation instructions to generate a second plurality of layers based on the object model data alone. The number of layers in the second plurality of layers may be predetermined. In this example, the second plurality of layers is generated so as to have a relatively high opacity. For example, the opacity of each layer of the second plurality of layers may match the relatively high opacity portions of the pattern. The at least one layer generated in block 212 is to be generated between the first and second plurality of layers (which, for convenience, are hereinafter referred to as 'top and bottom' layers).

In some examples, the top and bottom layers, as well as the darker regions of the variable opacity pattern, are to be formed using a common fusing agent. In one example, the common fusing agent is the cost-effective carbon black based fusing agent.

In some examples, the pattern may be formed in all layers which are not designated as top and bottom layers, i.e. to all other object layers which are not in the first plurality of layers or the second plurality of layers. For example, if an object is to be generated in 30 layers, there may be a predetermined number of bottom layers (for example, 10) and a predetermined number of top layers (for example, 10), in which case, the pattern may be added to the remaining 10 layers. This may assist in allowing the pattern to be distinguished when the object is illuminated, for example, backlit.

Providing as many intermediate layers with the pattern as possible, and/or providing a pattern which is provided by light or untreated build material surrounded by darker build material (for example, build material treated using a carbon black based fusing agent) assists in providing a pattern which is clearly visible. However, in other examples, the pattern may be added to a subset of the intermediate layers.

Block 216 comprises printing (or generating) the object using the object generation instructions. For example, this may comprise forming a layer of build material, applying print agents, for example through use of 'inkjet' liquid distribution technologies, in location specified in the object generation instructions for an object model slice corresponding to that layer, and applying energy, for example heat, to the layer. Some techniques allow for accurate placement of print agent on a build material, for example by using print heads operated according to inkjet principles of two-dimensional printing to apply print agents, which in some examples may be controlled to apply print agents with a resolution of around 600 dpi, or 1200 dpi. A further layer of build material may then be formed and the process repeated, with the object generation instructions for the next slice.

In some examples, blocks 210 to 214 may be carried out at least partially concurrently with object generation in block 216. As the processes of blocks 210 to 214 can be relatively resource heavy in terms of processing power and memory storage, this may make efficient use of the resources available.

The method therefore allows for the automatic incorporation of a pattern into an object to be generated. This may for example be an effective and efficient method of adding variable data, such as an identifier, to an object. In this example, the ability to make a voxel-wise replacement of model data with pattern data aids efficiency.

Figure 3:
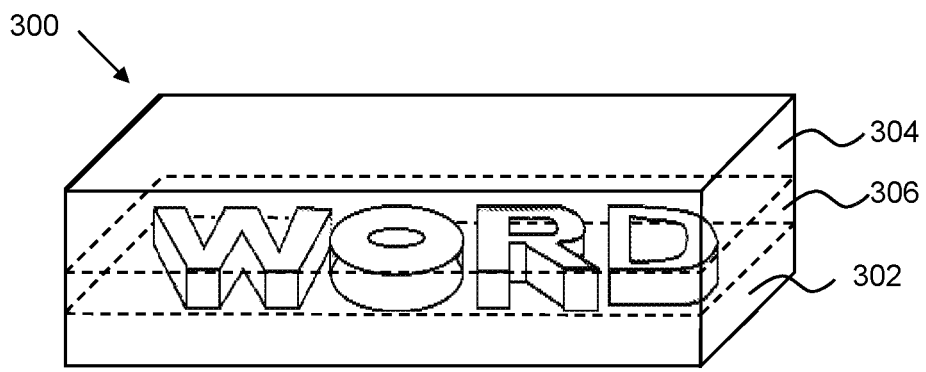
FIG. 3 is an example of a three-dimensional printed object.

FIG. 3 shows an example of a three-dimensional printed object 300, in this example a cuboid, which shows an intended placement of a pattern formed within an object. The object 300 comprises a first masking portion 302 (in this example, the bottom section of the object 300), a second masking portion 304 (in this example, the top section of the object 300) and a patterned portion 306 arranged between the first and second masking portions 302, 304. The patterned portion 306 in this example comprises a word which extends through the patterned portion 306 of the object 300.

Although not shown in the Figure to allow the location of the pattern to be seen, in practice, the patterned portion 306 comprises a pattern formed by a first section having a first translucency (the letters of the word) and a second section (the portions of the object surrounding the word) having a second translucency. The first translucency is greater than the second translucency. For example, the letters may be printed with low-tint fusing agent, when generating the object. The first and second masking portions 302, 304 have a third translucency. The first translucency (the translucency of the letters in this example) is also greater than the third translucency. In some examples, in each layer of the object 300 as printed, the third translucency is the same as the second translucency. In other examples, rather than being printed with a low-tint fusing agent, the letters may be, as a whole, more translucent than the surrounding portion by being formed of a pattern as discussed in relation to FIG. 4 below. In other examples, there may more translucency levels in the pattern and/or the object.

The object 300 is arranged such that the pattern is visible when the three-dimensional printed object 300 is backlit and not visible (or at least not clearly visible) when the object 300 is not backlit. Thus, the masking portions 302, 304 may generally mask the pattern but the sections of greater translucency become visible when the object 300 is backlit. The pattern may also be arranged such that a perimeter portion provides masking from the object sides.

In some examples, the object 300 may be manufactured using blocks of the methods of FIG. 1 and/or FIG. 2.

Figure 4:
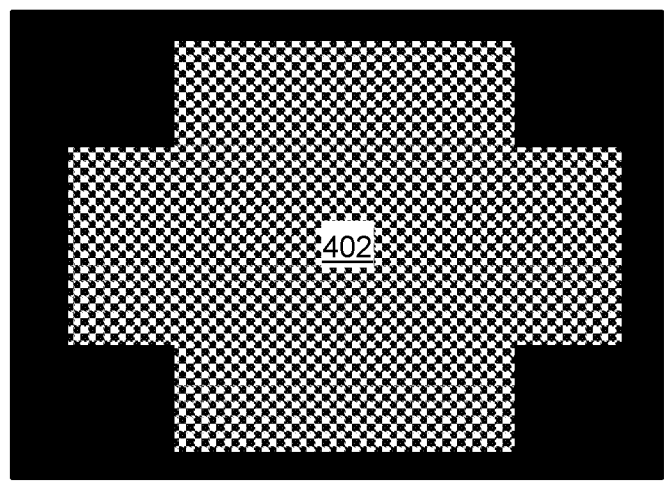
FIG. 4 shows an example of a pattern in a three-dimensional printed object.

FIG. 4 shows an example of a pattern 402 which may be printed in a plurality of layers. The pattern 402 is printed using a carbon black based fusing agent, and the printed portions are interspersed with untreated (blank or white) portions in a chequerboard pattern. The pattern 402 is arranged so as to have at least a threshold density, where the printed portions are well dispersed over the surface area, such that sufficient heat may be generated in manufacture to cause the untreated portions to fuse. The pattern in this example is printed at a scale so as to be visible to the human eye. For example, it has been demonstrated that patterns with white areas of around 0.2 mm (which may equate to around 5 pixels/voxels when working at 600 dpi, such that the voxels are 42 micron$^2$ in an x-y plane) are visible. However, in other examples, the pattern may comprise the "+" shape shown, with the pattern resulting in a reduced opacity on average over the region of the + shape compared to its more opaque surroundings. For example, the pattern may be smaller such that the individual squares are not individually discernible, but the + appears as a 'grey' portion of reduced opacity in a black surrounding (outside the + shape), both being printed with a carbon black fusing agent.

Figure 5:
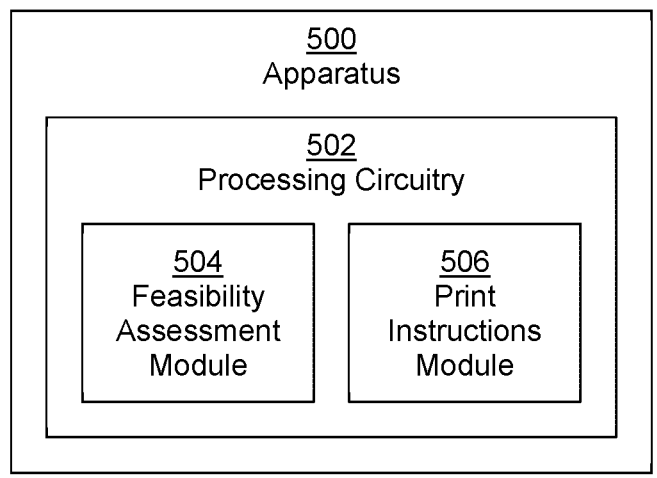
FIG. 5 is a simplified schematic drawing of an example of apparatus for processing data for additive manufacturing.

FIG. 5 shows an apparatus 500 comprising processing circuitry 502. The processing circuitry 502 comprises a feasibility assessment module 504 and a print instructions module 506.

The feasibility assessment module 504, in use of the apparatus 500, assesses a feasibility of including a pattern described by pattern data in an object described by object model data. The object described in the object model data is to be generated using additive manufacturing. The pattern is a pattern of variable opacity which is to be formed internally within the object. The pattern data may have any of the attributes described in relation to pattern data above. For example, the feasibility assessment module 504, may assess a feasibility of including the pattern, for example as set out in relation to block 208 above. In some examples, the feasibility assessment module 504 assesses the feasibility of including a pattern described by pattern data based on at least one of: (i) a determination that the object comprises a number of layers, wherein the number of layers exceeds a threshold, (ii) a determination that a proportion of a pattern which is to be solidified exceeds a threshold, and (iii) a determination that a proportion of the pattern which is to receive fusing agent exceeds a threshold. The feasibility assessment module 504 may determine a placement of the pattern by identifying an object portion which is suitably sized (e.g. formed of enough layers (and in some examples, not too many layers) and/or having a large enough footprint) to receive the pattern.

The print instructions module 506, in use of the apparatus 500, determines print instructions for generating the object. On a positive determination of the feasibility assessment module 504, the print instructions module 506 generates instructions for generating the object in a plurality of layers, such that at least one intermediate layer comprises the pattern. The print instructions generated by the print instructions module 506 may associate amount of print agent with each of a plurality of pixels (or, viewed another way, the voxels of a single layer to be generated). Each pixel/voxel may correspond to a region of a layer of build material. In some examples, the pattern data may describe the pattern in terms of pixels (or voxels of a layer). The print instructions module 506 may combine object model data and pattern data in a pixel wise manner. By configuring and adding the pattern data in this way, computing resources may remain relatively low and a pixel-size accuracy of pattern formation may be obtained, without modification to the exterior of the generated object.

Figure 6:
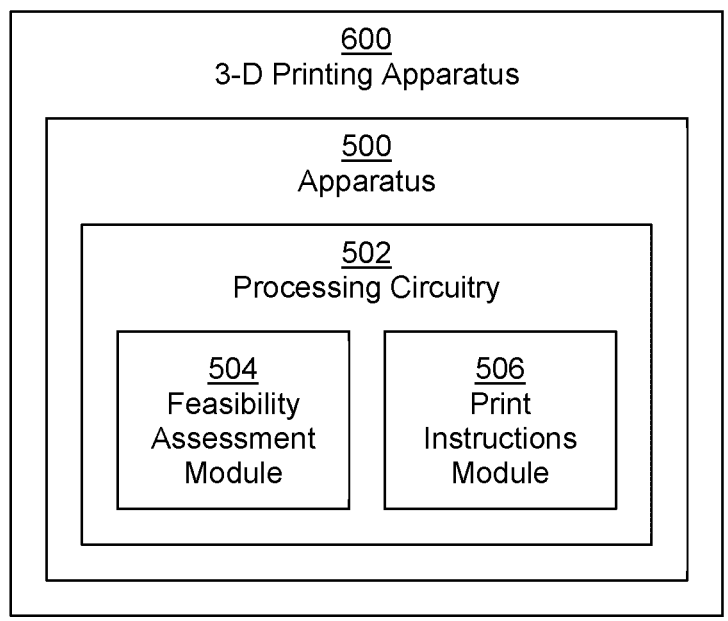
FIG. 6 is a simplified schematic drawing of an example apparatus for additive manufacturing.

FIG. 6 shows an example of 3-D printing apparatus 600. The 3-D printing apparatus 600 comprises the apparatus 500 of FIG. 5.

In some examples, the 3-D printing apparatus 600 may operate under the control of control data generated based on the print instructions to generate at least one object in a plurality of layers according to the generated control data/print instructions. The 3-D printing apparatus 600 may generate an object in layer-wise manner by selectively solidifying portions of layers of build materials. The selective solidification may in some examples be achieved by selectively applying print agents, for example through use of 'inkjet' liquid distribution technologies, and applying energy, for example heat, to the layer. The 3-D printing apparatus 600 may comprise additional components not shown herein, for example a fabrication chamber, a print bed, print head(s) for distributing print agents, a build material distribution system for providing layers of build material, energy sources such as heat lamps and the like, which are not described in detail herein.

The processing circuitry 502 or the modules thereof, and/or the 3-D printing apparatus 600 may carry out any or any combination of the blocks of FIG. 1 or FIG. 2.

Examples in the present disclosure can be provided as methods, systems or machine-readable instructions, such as any combination of software, hardware, firmware or the like. Such machine-readable instructions may be included on a computer readable storage medium (including but not limited to disc storage, CD-ROM, optical storage, etc.) having computer readable program codes therein or thereon.

The present disclosure is described with reference to flow charts and/or block diagrams of the method, devices and systems according to examples of the present disclosure. Although the flow diagrams described above show a specific order of execution, the order of execution may differ from that which is depicted. Blocks described in relation to one flow chart may be combined with those of another flow chart. It shall be understood that each block in the flow charts and/or block diagrams, as well as combinations of the blocks the flow charts and/or block diagrams, can be realized using machine readable instructions.

The machine-readable instructions may, for example, be executed by a general-purpose computer, a special purpose computer, an embedded processor or processors of other programmable data processing devices to realize the functions described in the description and diagrams. In particular, a processor or processing apparatus may execute the machine-readable instructions. Thus, functional modules of the apparatus (such as the feasibility assessment module 504 and/or the print instructions module 506) may be implemented by a processor executing machine readable instructions stored in a memory, or a processor operating in accordance with instructions embedded in logic circuitry. The term 'processor' is to be interpreted broadly to include a CPU, processing unit, ASIC, logic unit, or programmable gate array etc. The methods and functional modules may all be performed by a single processor or divided amongst several processors.

Such machine-readable instructions may also be stored in a computer readable storage that can guide the computer or other programmable data processing devices to operate in a specific mode.

Machine readable instructions may also be loaded onto a computer or other programmable data processing device(s), so that the computer or other programmable data processing device(s) perform a series of operations to produce computer-implemented processing, thus the instructions executed on the computer or other programmable devices realize functions specified by block(s) in the flow charts and/or the block diagrams.

Further, the teachings herein may be implemented in the form of a computer software product, the computer software product being stored in a storage medium and comprising a plurality of instructions for making a computer device implement the methods recited in the examples of the present disclosure.

While the method, apparatus and related aspects have been described with reference to certain examples, various modifications, changes, omissions, and substitutions can be made without departing from the spirit of the present disclosure. It is intended, therefore, that the method, apparatus and related aspects be limited by the scope of the following claims and their equivalents. It should be noted that the above-mentioned examples illustrate rather than limit what is described herein, and that those skilled in the art will be able to design many alternative implementations without departing from the scope of the appended claims. Features described in relation to one example may be combined with features of another example.

The word "comprising" does not exclude the presence of elements other than those listed in a claim, "a" or "an" does not exclude a plurality, and a single processor or other unit may fulfil the functions of several units recited in the claims.

The features of any dependent claim may be combined with the features of any of the independent claims or other dependent claims.

The invention claimed is:

1. A method comprising: receiving, by at least one processor, object model data, the object model data describing an object to be generated by an additive manufacturing technique in which, on a layer-by-layer basis, layers of build material are supplied, selectively treated with a fusing agent, and selectively solidified via fusing; determining, by the at least one processor, pattern data, describing a pattern of variable opacity to be formed internally within the object, the pattern of variable opacity having higher and lower opacity regions with a human eye-perceptible opacity variation therebetween; determining, by the at least one processor, instructions for generating object generation instructions specifying: forming a plurality of intermediate layers of the build material to have the pattern of variable opacity, including applying the fusing agent to first portions of each intermediate layer that are to be solidified via fusing and that correspond to the higher opacity regions in the pattern and not applying any fusing agent to second portions of each intermediate layer that are to be solidified and that correspond to the lower opacity regions in the pattern, wherein during fusing heat transferred from the first portions to which the fusing agent has been applied to the second portions to which no fusing agent has been applied causes solidification of the second portions; and printing the object using the additive manufacturing technique in accordance with the object generation instructions.

2. The method of claim 1, wherein the pattern of variable opacity is determined to have at least a threshold density of the higher opacity regions relative to the lower opacity regions such that for each intermediate layer, the second portions to which no fusing agent has been applied are solidified during fusing via transfer of the heat from the first portions to which the fusing agent has been applied.

3. The method of claim 1, wherein the pattern of variable opacity is determined so that the lower opacity regions are sufficiently dispersed relative to the higher opacity regions within the pattern such that for each intermediate layer, the second portions to which no fusing agent has been applied are solidified during fusing via transfer of the heat from the first portions to which the fusing agent has been applied.

4. The method of claim 1, wherein the pattern of variable opacity is determined to have at least a threshold density of the higher opacity regions relative to the lower opacity regions, and the pattern of variable opacity is determined so that the lower opacity regions are sufficiently dispersed relative to the higher opacity regions within the pattern, such that for each intermediate layer, the second portions to which no fusing agent has been applied are solidified during fusing via transfer of the heat from the first portions to which the fusing agent has been applied.

5. The method of claim 1, wherein the object are specified to generate the object as a plurality of layers of the build material, a plurality of intermediate layers, such that the pattern of variable opacity is visible when the object is backlit and is not visible or not as clearly visible when the object is not backlit.

6. The method of claim 5, wherein the object instructions are specified to generate the object as the plurality of layers of the build material such that the pattern of variable opacity is visible when the object is backlit and is not visible or not as clearly visible when the object is not backlit by further specifying: prior to forming the intermediate layers, forming a plurality of bottom layers of the build material, including applying a fusing agent to every portion of each bottom layer that are to be solidified, such that the bottom layers have an opacity of the higher opacity regions within the pattern of the intermediate layers; and after forming the intermediate layers, forming a plurality of top layers of the build material over the intermediate layers, including applying the fusing agent to portions of each top layer that are to be solidified, such that the top layers have the opacity of the higher opacity regions within the pattern of the intermediate layers.

7. An apparatus comprising: a processor; and a memory storing program code executable by the processor to: receiving object model data, the object model data describing an object to be generated by an additive manufacturing technique in which, on a layer-by-layer basis, layers of build material are supplied, selectively treated with a fusing agent, and selectively solidified via fusing; determine pattern data, describing a pattern of variable opacity to be formed internally within the object, the pattern of variable opacity having higher and lower opacity regions with a human eye-perceptible opacity variation therebetween; determine instructions for generating object generation instructions specifying: forming a plurality of intermediate layers of the build material to have the pattern of variable opacity, including applying the fusing agent to first portions of the each intermediate layer that are to be solidified via fusing and that correspond to the higher opacity regions in the pattern and not applying any fusing agent to second portions of each intermediate layer that are to be solidified and that correspond to the lower opacity regions in the pattern, wherein during fusing heat transferred from the first portions to which the fusing agent has been applied to the second portions to which no fusing agent has been applied causes solidification of the second portions; and print the object using the additive manufacturing technique in accordance with the object generation instructions.

8. The apparatus of claim 7, wherein the pattern of variable opacity is determined to have at least a threshold density of the higher opacity regions relative to the lower opacity regions such that for each intermediate layer, the second portions to which no fusing agent has been applied are solidified during fusing via transfer of the heat from the first portions to which the fusing agent has been applied.

9. The apparatus of claim 7, wherein the pattern of variable opacity is determined so that the lower opacity regions are sufficiently dispersed relative to the higher opacity regions within the pattern such that for each intermediate layer, the second portions to which no fusing agent has been applied are solidified during fusing via transfer of the heat from the first portions to which the fusing agent has been applied.

10. The apparatus of claim 7, wherein the pattern of variable opacity is determined to have at least a threshold density of the higher opacity regions relative to the lower opacity regions, and the pattern of variable opacity is determined so that the lower opacity regions are sufficiently dispersed relative to the higher opacity regions within the pattern, such that for each intermediate layer, the second portions to which no fusing agent has been applied are solidified during fusing via transfer of the heat from the first portions to which the fusing agent has been applied.

11. The apparatus of claim 7, wherein the object instructions are specified to generate the object as a plurality of layers of the build material, including a plurality of intermediate layers, such that the pattern of variable opacity is visible when the object is backlit and is not visible or not as clearly visible when the object is not backlit.

12. The apparatus of claim 11, wherein the object instructions are specified to generate the object as the plurality of layers of the build material such that the pattern of variable opacity is visible when the object is backlit and is not visible or not as clearly visible when the object is not backlit by further specifying: prior to forming the intermediate layers, forming a plurality of bottom layers of the build material, including applying a fusing agent to every portion of each bottom layer that are to be solidified, such that the bottom layers have an opacity of the higher opacity regions within the pattern of the intermediate layers; and after forming the intermediate layers, forming a plurality of top layers of the build material over the intermediate layers, including applying the fusing agent to portions of each top layer that are to be solidified, such that the top layers have the opacity of the higher opacity regions within the pattern of the intermediate layers.

13. A non-transitory computer-readable data storage medium storing program code executable by a processor to perform processing comprising: receiving object model data, the object model data describing an object to be generated by an additive manufacturing technique in which, on a layer-by-layer basis, layers of build material are supplied, selectively treated with a fusing agent, and selectively solidified via fusing; determining pattern data, describing a pattern of variable opacity to be formed internally to—within the object, the pattern of variable opacity having higher and lower opacity regions with a human eye—perceptible opacity variation therebetween; determining instructions for generating object generation instructions specifying: forming a plurality of intermediate layers of the build material to have the pattern of variable opacity, including applying the fusing agent to first portions of each intermediate layer that are to be solidified via fusing and that correspond to the higher opacity regions in the pattern and not applying any fusing agent to second portions of each intermediate layer that are to be solidified and that correspond to the lower opacity regions in the pattern, wherein during fusing heat transferred from the first portions to which the fusing agent has been applied to the second portions to which no fusing agent has been applied causes solidification of the second portions; and printing the object using the additive manufacturing technique in accordance with the object generation instructions.

14. The non-transitory computer-readable data storage medium of claim 13, wherein the pattern of variable opacity is determined to have at least a threshold density of the higher opacity regions relative to the lower opacity regions such that for each intermediate layer, the second portions to which no fusing agent has been applied are solidified during fusing via transfer of the heat from the first portions to which the fusing agent has been applied.

15. The non-transitory computer-readable data storage medium of claim 13, wherein the pattern of variable opacity is determined so that the lower opacity regions are sufficiently dispersed relative to the higher opacity regions within the pattern such that for each intermediate layer, the second portions to which no fusing agent has been applied are solidified during fusing via transfer of the heat from the first portions to which the fusing agent has been applied.

16. The non-transitory computer-readable data storage medium of claim 13, wherein the pattern of variable opacity is determined to have at least a threshold density of the higher opacity regions relative to the lower opacity regions, and the pattern of variable opacity is determined so that the lower opacity regions are sufficiently dispersed relative to the higher opacity regions within the pattern, such that for each intermediate layer, the second portions to which no fusing agent has been applied are solidified during fusing via transfer of the heat from the first portions to which the fusing agent has been applied.

17. The non-transitory compute r-readable data storage medium of claim 13, wherein the object instructions are specified to generate the object as a plurality of layers of the build material, including a plurality of intermediate layers, such that the pattern of variable opacity is visible when the object is backlit and is not visible or not as clearly visible when the object is not backlit.

18. The non-transitory computer-readable data storage medium of claim 17, wherein the object instructions are specified to generate the object as the plurality of layers of the build material such that the pattern of variable opacity is visible when the object is backlit and is not visible or not as clearly visible when the object is not backlit by further specifying: prior to forming the intermediate layers, forming a plurality of bottom layers of the build material, including applying a fusing agent to every portion of each bottom layer that are to be solidified, such that the bottom layers have an opacity of the higher opacity regions within the pattern of the intermediate layers; and after forming the intermediate layers, forming a plurality of top layers of the build material over the intermediate layers, including applying the fusing agent to portions of each top layer that are to be solidified, such that the top layers have the opacity of the higher opacity regions within the pattern of the intermediate layers.

* * * * *